(12) United States Patent
Erickson et al.

(10) Patent No.: US 10,958,198 B2
(45) Date of Patent: Mar. 23, 2021

(54) USING INTERRUPT TO AVOID SHORT PULSE IN CENTER ALIGNED PWM

(71) Applicant: Vitesco Technologies USA, LLC, Auburn Hills, MI (US)

(72) Inventors: Benjamin J. Erickson, Ann Arbor, MI (US); Lakshmi Narayana Sharma Tejomurtula, Novi, MI (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 0 days.

(21) Appl. No.: 16/596,049

(22) Filed: Oct. 8, 2019

(65) Prior Publication Data
US 2020/0119672 A1 Apr. 16, 2020

Related U.S. Application Data

(60) Provisional application No. 62/743,868, filed on Oct. 10, 2018.

(51) Int. Cl.
| | | |
|---|---|---|
| *H03H 11/26* | (2006.01) | |
| *H02P 7/29* | (2016.01) | |
| *H03K 7/08* | (2006.01) | |

(52) U.S. Cl.
CPC ........ *H02P 7/29* (2013.01); *H03K 7/08* (2013.01)

(58) Field of Classification Search
CPC ...... H02M 1/32; H02M 1/38; H02M 7/53871; H02M 7/5395; H02P 27/085; H02P 7/29; H03K 17/06; H03K 17/28; H03K 7/08
See application file for complete search history.

(56) References Cited

U.S. PATENT DOCUMENTS

| | | |
|---|---|---|
| 4,882,120 A | 11/1989 | Roe et al. |
| 6,714,424 B2 | 3/2004 | Deng et al. |
| 2004/0037097 A1 | 2/2004 | Deng et al. |
| 2008/0150604 A1* | 6/2008 | Huber .................. H02M 7/538 327/290 |
| 2016/0254760 A1 | 9/2016 | Zhang et al. |
| 2018/0331682 A1* | 11/2018 | Duduman ............... H02M 1/38 |

FOREIGN PATENT DOCUMENTS

| | | |
|---|---|---|
| EP | 3062428 A2 | 8/2016 |
| WO | 2008/139793 A1 | 11/2008 |

OTHER PUBLICATIONS

International Search Report and Written Opinion dated Jan. 27, 2020 from corresponding International Patent Application No. PCT/US2019/055621.

* cited by examiner

*Primary Examiner* — Muhammad S Islam

(57) ABSTRACT

A system includes an electric motor, at least one pair of high side and low side switches connected to the electric motor, and a microcontroller connected to the high side and low side switches. At least the low side switches have a minimum on-time requirement. The microcontroller controls the switches by outputting a pulse-width modulation (PWM) signal. At least the PWM signal outputted to the low side switch is center-aligned to the off-time. When a request is made to the microcontroller resulting in a low side on-time of zero with a previous duty cycle request that is greater than a predetermined threshold, the microcontroller is constructed and arranged to extend the duty cycle of the low side switch of the at least one pair of switches into the next period to a duration of the required minimum on-time.

16 Claims, 4 Drawing Sheets

USING INTERRUPT TO AVOID SHORT PULSE IN CENTER ALIGNED PWM

This application claims the benefit of the earlier filing date of U.S. Provisional Application No. 62/743,868, filed on Oct. 10, 2018, which is hereby incorporated by reference into this specification.

TECHNICAL FIELD

This disclosure relates to a method and device that is capable of avoiding short pulse in center aligned PWM (pulse-width modulation) using interrupt in an electrical motor, for example a 48 volt belt starter generator (BSG).

BACKGROUND

Hybrid electric vehicles (HEVs) are a type of hybrid vehicles and electric vehicles that combine a conventional internal combustion engine (ICE) propulsion system and an electric propulsion system (hybrid vehicle drivetrain). HEVs achieve better fuel economy than conventional vehicles. Several types of HEVs exist, and the degree to which each functions as an electric vehicle varies as well. Hybrid electric cars are the most common of the HEVs; however, there is a recent surge in hybrid electric trucks and buses.

HEVs may be classified based on how power is supplied to their drivetrain. For example, HEVs may be classified as parallel hybrids, series hybrids, or power-split hybrids. Most hybrid vehicles use regenerative braking to recharge the batteries.

Recently, automakers have been replacing several traditionally mechanically driven vehicle components with more efficient parts like electric power steering racks, electric brake vacuum pumps, and electric water pumps, to name a few. Therefore, the standard 12-volt electric system are being stretched thin. As such, 48-volt systems are slowly stepping in to accommodate the need for more on-board vehicle power.

In a conventional PWM motor control scheme, a problem occurs when short PWM pulses are not allowed by the hardware design (i.e., there is some minimum PWM on time), and a buffered center-aligned PWM scheme for the high-side and low-side switches is used to create an effective phase duty cycle. This will cause a short pulse on the low-side as the phase duty cycle approaches 100%. In particular, with reference to FIG. 1, the problem occurs when a phase duty cycle request goes above a threshold where the sum of the low-side on-time is less than 2*(deadtime+minimum on-time), and then the next duty cycle request results in a low-side on-time of 0. This occurs since the low-side PWM is center-aligned to the off-time, which divides the on-time between two pulses: pulse A at the beginning of the period, and pulse B at the end of the period. Additionally, the deadtime is typically applied by microcontroller timer peripherals by delaying the start of the end pulse without changing the end of the period, effectively shortening that pulse. Because the next low-side on-time is 0, there is no pulse at the beginning of the period, and the pulse ends at a duration shorter than the minimum on-time.

Thus, there is a need in a center-aligned PWM motor control scheme to extend the short pulse, into the next period, to a duration of the required minimum on-time

SUMMARY

An object of the invention is to fulfill the need referred to above. In accordance with the principles of an embodiment, this objective is obtained by providing a system including an electric motor, at least one pair of high side and low side switches connected to the electric motor. At least the low side switches have a minimum on-time requirement. A microcontroller is connected to the at least one pair of high side and low side switches. The microcontroller is constructed and arranged to control the high side switch and the low side switch of the at least one pair of switches by outputting a pulse-width modulation (PWM) signal to each of the high side switch and the low side switch of the at least one pair of switches. At least the PWM signal outputted to the low side switch of the at least one pair of switches is center-aligned to the off-time. When a request is made to the microcontroller resulting in a low side on-time of zero with a previous duty cycle request that is greater than a predetermined threshold, the microcontroller is constructed and arranged to extend the duty cycle of the low side switch of the at least one pair of switches into the next period to a duration of the required minimum on-time.

In accordance with another aspect of the disclosed embodiment, a method controls an electric motor. At least one pair of high side and low side switches are connected to the electric motor, and a microcontroller is connected to the at least one pair of high side and low side switches. At least the low side switches have a minimum on-time requirement. The method provides the microcontroller to control the high side switch and the low side switch of the at least one pair of switches by outputting a pulse-width modulation (PWM) signal to each of the high side switch and the low side switch of the at least one pair of switches. At least the PWM signal outputted to the low side switch of the at least one pair of switches is center-aligned to the off-time. When a request is made to the microcontroller resulting in a low side on-time of zero with a previous duty cycle request that is greater than a predetermined threshold, the microcontroller causes the duty cycle of the low side switch of the at least one pair of switches to extend into the next period to a duration of the required minimum on-time.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

DESCRIPTION OF DRAWINGS

Like reference symbols in the various drawings indicate like elements.

DETAILED DESCRIPTION OF EXAMPLE EMBODIMENTS

Figure 2:
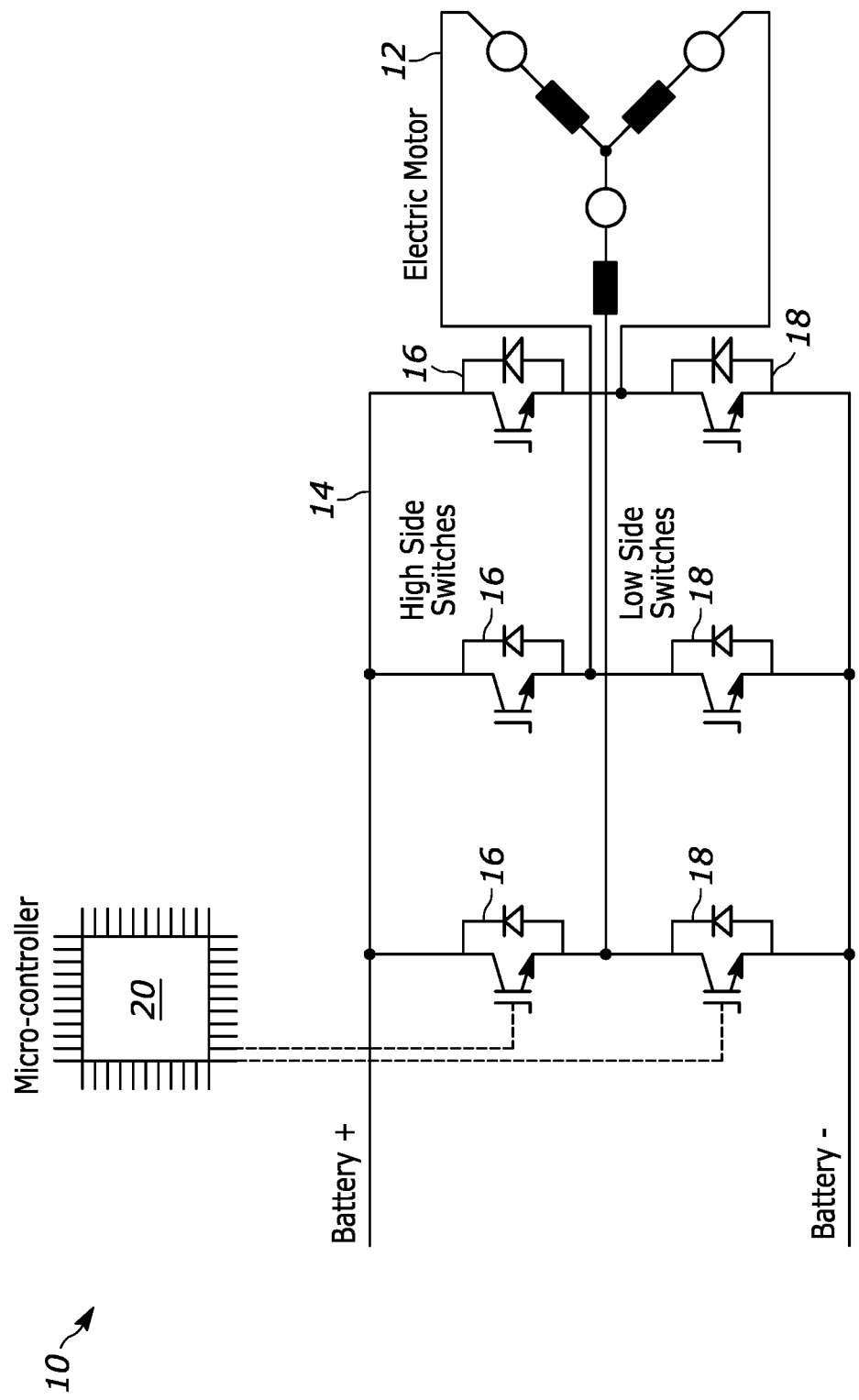
FIG. 2 illustrates a system having a microcontroller, high side and low side switches, and an electric motor, in accordance with an embodiment.

With reference to FIG. 2, a system for motor control is shown generally indicated at 10 in accordance with an embodiment. The system 10 includes an electric motor 12 that is preferably controlled via 3-phase power circuit structure 14 that is connected to 48 volt battery power. The system can be applied to 12 volt motors, or motors that operate at voltages greater than 48 volts. The electric motor 12 converts electrical energy into mechanical energy. The circuit structure 14 includes high side (HS) switches 16 and low side (LS) switches 18 arranged in pairs. Each HS/LS switch pair controls one phase of the electric motor 12. The system 10 also includes a microcontroller 20 that controls each switch with a PWM output. The switches 16 and 18 can be any type of electrical switch, such as a MOSFET, or an insulated-gate bipolar transistor (IGBT).

A driver of the microcontroller 20 will take a phase duty cycle request for each phase as input and create resulting output waveforms to each of the LS switches 18 and the HS switches 16 of each phase. These output waveforms can be described as combinations of ON times and OFF times, where the sum of the ON and OFF times are the period for any given switching period. For duty cycles in between 0% and 100%, the HS and LS switches must be switched on and off to achieve the requested duty cycle for the corresponding phase. At least the low side switches 18 have a minimum on-time requirement.

Figure 1:
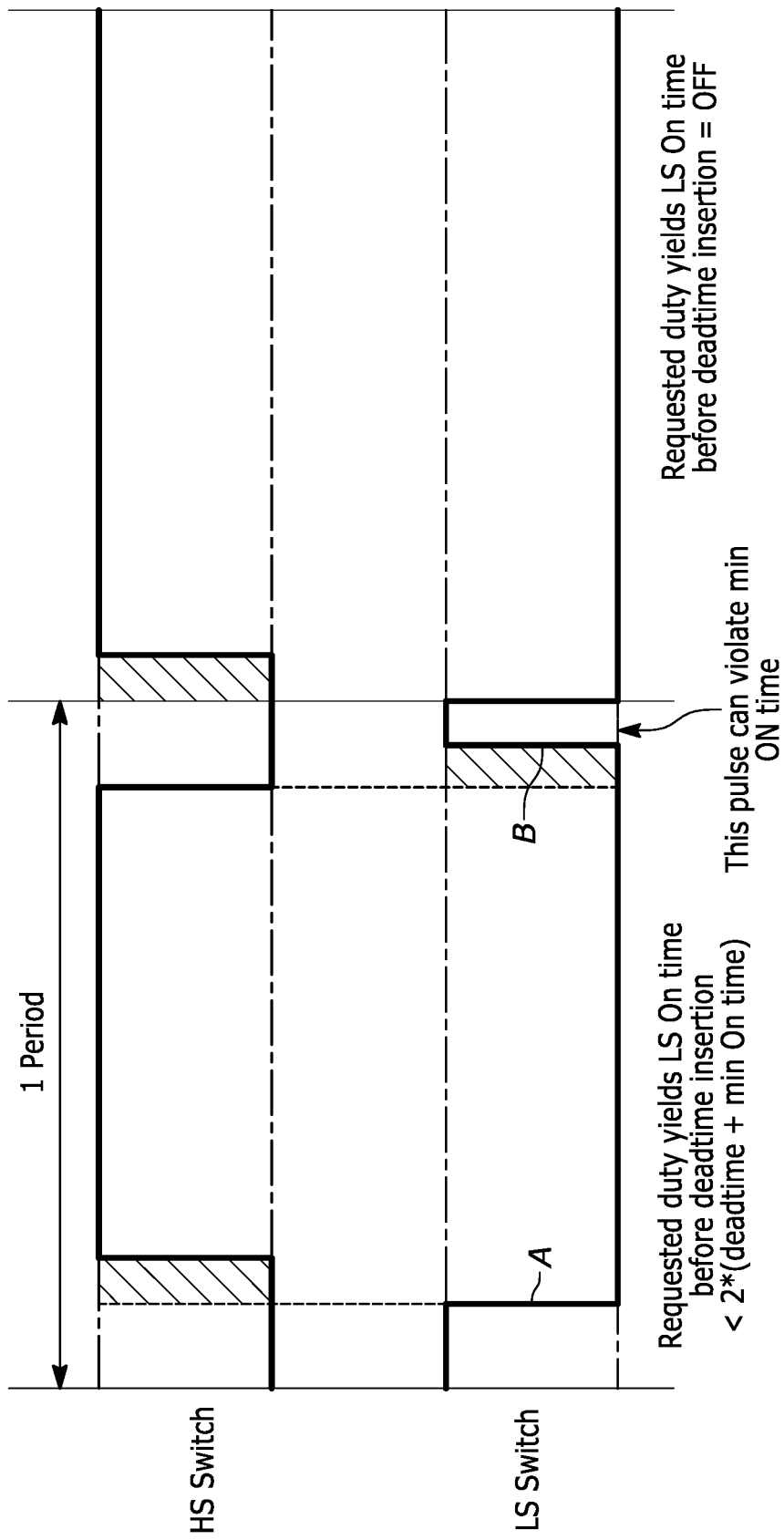
FIG. 1 illustrates low side and high side PWM pulses of a conventional center-aligned PWM motor control scheme causing a short pulse on the low side as the phase duty cycle approaches 100%.
Figure 3:
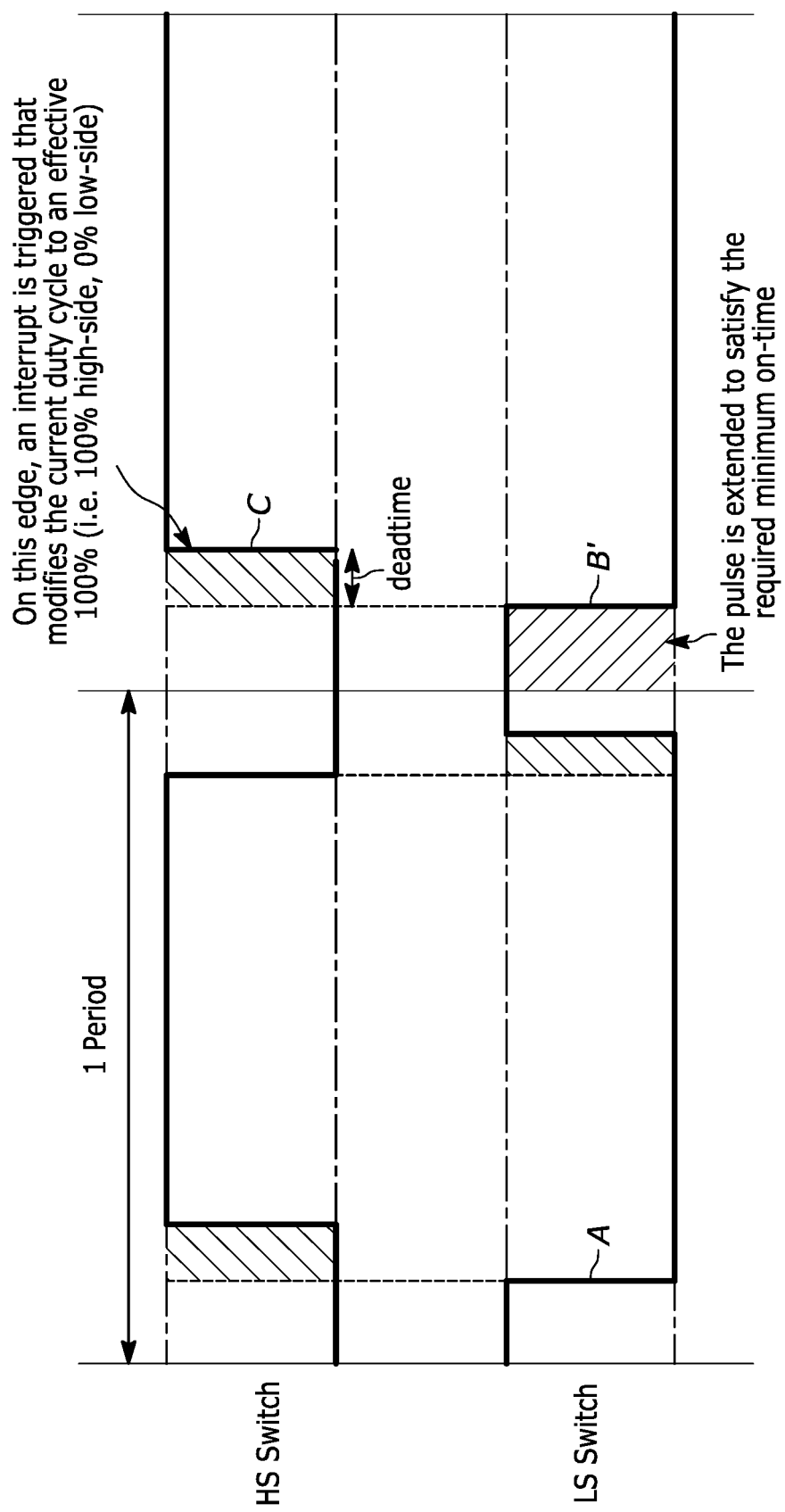
FIG. 3 illustrates low side and high side PWM pulses of a center-aligned PWM scheme for controlling the motor of FIG. 2 that extends the pulse on the low side to satisfy the required minimum on time.

In accordance with the embodiment, when a request to the microcontroller 20 is made that will result in a low-side on-time of 0 with a previous phase duty cycle request that is greater than a threshold of 2*(deadtime+minimum on-time), the microcontroller 20 is constructed and arranged to temporarily extend the short pulse B of FIG. 1 to pulse B' of FIG. 3 and into the next period by assigning a non-zero duty cycle for this next period to the duty cycle that will effectively extend the short pulse to the duration of the minimum on-time. The minimum on-time is the time that a switch must remain on once it is switched ON. The deadtime is defined as a time after switching OFF the high side switch of the at least one pair of switches and before switching ON the low side switch of that pair, and vice versa.

Also, the microcontroller 20 is constructed and arranged to then trigger an interrupt on the rising edge C of the high-side pulse (i.e., after deadtime is completed) so that the originally requested duty cycle can then be applied (i.e., 100% phase, or 100% high-side, 0% low-side) since the output states will already match the request at that time. The microcontroller 20 does not change the PWM (pulse width modulation) scheme (i.e., it remains center-aligned the entire time).

Figure 4:
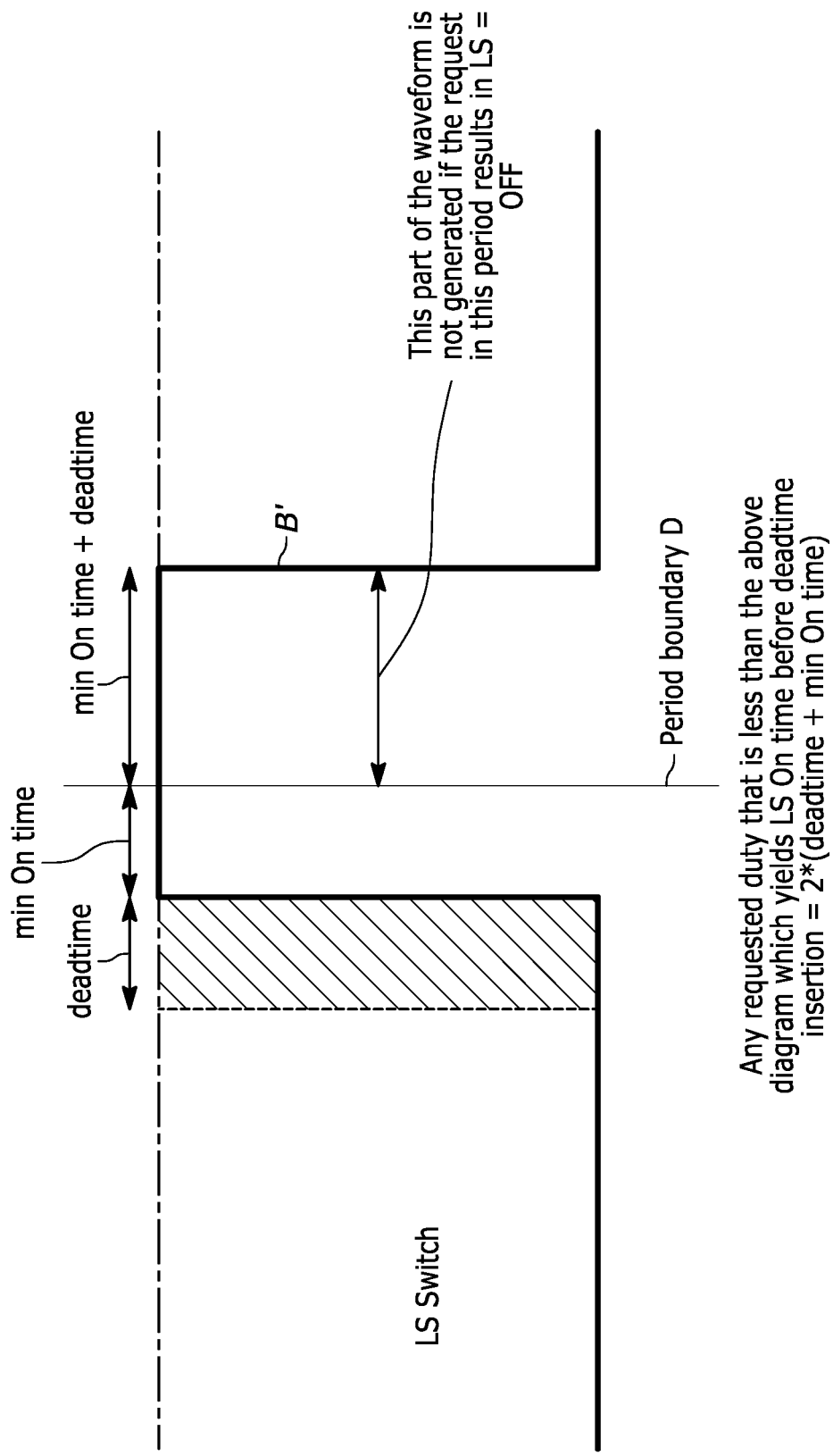
FIG. 4 illustrates an enlarged view of an extended pulse of a low side switch for defining a threshold of an embodiment.

FIG. 4 shows an enlarged view of a low side switch signal with nomenclature for the calculation for the threshold noted above. The signal shows two consecutive periods of the minimum duty cycle. Thus, the signal is high on both sides of the period boundary D. The low-side pulses, since they are center-aligned to the off-time, will always go across the period boundary D (assuming a non-zero preceding/following duty cycle as in FIG. 4). If the following duty cycle for the low-side is 0, then the part of the pulse B' after the period boundary D will not be generated, and the resulting pulse will be only the section labeled "min On time". Therefore, duty cycle requests yielding a low-side on-time of less than 2*(deadtime+min On time) are at risk if the next duty cycle request yields a low-side on time of 0.

By not changing the PWM motor control scheme (remains center-aligned), the system 10 advantageously leverages the resources of the microcontroller 20 that are intended for motor control. Additionally, the system and method simplifies the implementation by keeping the PWM motor control scheme more deterministic (that is, for any given period, the microcontroller peripheral will be center-aligned PWM mode) which reduces the likelihood of errors. This also reduces the execution time because the logic to decide the PWM parameters for the next period will be simpler.

The method provided by the system 10 can be applied on the high-side PWM for an "inverted polarity" phase PWM scheme (this is where the high-side PWM is center-aligned to its off-time, and the low-side PWM is center-aligned to its on-time). It is logically equivalent to the embodiment described above, expect that it is applied as the phase PWM approaches 0% (instead of when it approaches 100%).

For systems that do have a minimum on-time restriction, it's possible to simply disallow requests past the threshold. This is possible for systems where either the minimum on-time is very small or the switching period is big enough that the lost resolution is insignificant.

Various implementations of the systems and techniques described here can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Implementations of the subject matter and the functional operations described in this specification can be implemented in digital electronic circuitry, or in computer software, firmware, or hardware, including the structures disclosed in this specification and their structural equivalents, or in combinations of one or more of them. Moreover, subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The terms "data processing apparatus", "computing device" and "computing processor" encompass all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

One or more aspects of the disclosure can be implemented in a computing system that includes a backend component, e.g., as a data server, or that includes a middleware component, e.g., an application server, or that includes a frontend component, e.g., a client computer having a graphical user interface or a Web browser through which a user can interact with an implementation of the subject matter described in this specification, or any combination of one or more such backend, middleware, or frontend components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multi-tasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the disclosure. Accordingly, other implementations are within the scope of the following claims. For example, the actions recited in the claims can be performed in a different order and still achieve desirable results.

What is claimed is:

1. A system comprising:
an electric motor;
at least one pair of high side and low side switches connected to the electric motor, at least the low side switches have a minimum on-time requirement; and
a microcontroller connected to the at least one pair of high side and low side switches, the microcontroller being constructed and arranged to control the high side switch and the low side switch of the at least one pair of switches by outputting a pulse-width modulation (PWM) signal to each of the high side switch and the low side switch of the at least one pair of switches, at least the PWM signal outputted to the low side switch of the at least one pair of switches being center-aligned to an off-time,
wherein when a request is made to the microcontroller resulting in a low side on-time of zero with a previous duty cycle request that is greater than a predetermined threshold, the microcontroller is constructed and arranged to extend the duty cycle of the low side switch of the at least one pair of switches into the next period to a duration of the required minimum on-time.

2. The system of claim 1, wherein the microcontroller is constructed and arranged to extend the duty cycle of the low side switch of the at least one pair of switches into the next period by assigning a non-zero duty cycle.

3. The system of claim 1, wherein after the microcontroller extends the duty cycle of the low side switch of the at least one pair of switches into the next period, the microcontroller is constructed and arranged to enable an edge triggered interrupt for a rising edge of the high-side switch of the at least one pair of switches, resulting in a phase PWM of 100% for the high side switch and a phase PWM of 0% for the low side switch of the at least one pair of switches.

4. The system of claim 1, wherein the threshold is defined as 2*(deadtime+minimum on-time), with the deadtime being defined as a time after switching OFF the high side switch of the at least one pair of switches and before switching ON the corresponding low side switch or as a time after switching OFF the low side switch of the at least one pair of switches and before switching ON the corresponding high side switch.

5. The system of claim 1, wherein the motor is a three-phase motor there are three pairs of high side and low side switches.

6. The system of claim 1, wherein the switches of the at least one pair of switches are each a transistor.

7. The system of claim 5, wherein the switches of the pairs of switches are each a transistor.

8. The system of claim 1, further comprising a 48 volt battery for powering the motor.

9. A method of controlling an electric motor, at least one pair of high side and low side switches being connected to the electric motor, and a microcontroller being connected to the at least one pair of high side and low side switches, at least the low side switches having a minimum on-time requirement, the method comprising the steps of:
providing the microcontroller to control the high side switch and the low side switch of the at least one pair of switches by outputting a pulse-width modulation (PWM) signal to each of the high side switch and the low side switch of the at least one pair of switches, at least the PWM signal outputted to the low side switch of the at least one pair of switches being center-aligned to an off-time,
when a request is made to the microcontroller resulting in a low side on-time of zero with a previous duty cycle request that is greater than a predetermined threshold, the microcontroller causes the duty cycle of the low side switch of the at least one pair of switches to extend into the next period to a duration of the required minimum on-time.

10. The method of claim 9, wherein the microcontroller causes the duty cycle of the low side switch of the at least one pair of switches to extend into the next period by assigning a non-zero duty cycle.

11. The method of claim 7, further comprising:
after the microcontroller extends the duty cycle of the low side switch of the at least one pair of switches into the next period, enabling, with the microcontroller, an edge triggered interrupt for a rising edge of the high-side switch of the at least one pair of switches, resulting in a phase PWM of 100% for the high side switch and a phase PWM of 0% for the low side switch of the at least one pair of switches.

12. The method of claim 7, wherein the threshold is defined as 2*(deadtime+minimum on-time), with the deadtime being defined as a time after switching OFF the high side switch of the at least one pair of switches and before switching ON the corresponding low side switch or as a time after switching OFF the low side switch of the at least one pair of switches and before switching ON the corresponding high side switch.

13. The method of claim 9, wherein the motor is a three-phase motor there are three pairs of high side and low side switches.

14. The method of claim 9, wherein the switches of the at least one pair of switches are each a transistor.

15. The method of claim 13, wherein the switches of the pairs of switches are each a transistor.

16. The method of claim 9, further comprising:
providing a 48 volt battery to power the motor.

* * * * *